US010236917B2

(12) United States Patent
Vaidhyanathan et al.

(10) Patent No.: US 10,236,917 B2
(45) Date of Patent: Mar. 19, 2019

(54) PROVIDING MEMORY BANDWIDTH COMPRESSION IN CHIPKILL-CORRECT MEMORY ARCHITECTURES

(71) Applicant: QUALCOMM Incorporated, San Diego, CA (US)

(72) Inventors: Natarajan Vaidhyanathan, Carrboro, NC (US); Luther James Blackwood, Raleigh, NC (US); Mattheus Cornelis Antonius Adrianus Heddes, Raleigh, NC (US); Michael Raymond Trombley, Cary, NC (US); Colin Beaton Verrilli, Apex, NC (US)

(73) Assignee: QUALCOMM Incorporated, San Diego, CA (US)

( * ) Notice: Subject to any disclaimer, the term of this patent is extended or adjusted under 35 U.S.C. 154(b) by 212 days.

(21) Appl. No.: 15/266,723

(22) Filed: Sep. 15, 2016

(65) Prior Publication Data
US 2018/0074893 A1    Mar. 15, 2018

(51) Int. Cl.
*H03M 13/00* (2006.01)
*G11C 29/52* (2006.01)
(Continued)

(52) U.S. Cl.
CPC ........ *H03M 13/6312* (2013.01); *G06F 3/064* (2013.01); *G06F 3/0608* (2013.01);
(Continued)

(58) Field of Classification Search
CPC ......... G06F 2211/1014; G06F 17/2252; G06F 2212/401; G06F 11/1068; G06F 3/0608;
(Continued)

(56) References Cited

U.S. PATENT DOCUMENTS 6,618,831 B2 *   9/2003   Lippincott ..........  G06F 13/4243
                                                       341/61
7,032,158 B2 *   4/2006   Alvarez, II ...........  G06F 9/4411
                                                    711/E12.089
(Continued)

FOREIGN PATENT DOCUMENTS

WO      2016126446 A1    8/2016

OTHER PUBLICATIONS

Co-pending U.S. Appl. No. 14/844,516, filed Sep. 3, 2015.
(Continued)

*Primary Examiner* — Shelly A Chase
*Assistant Examiner* — Osman M Alshack
(74) *Attorney, Agent, or Firm* — Withrow & Terranova, PLLC

(57) ABSTRACT

Providing memory bandwidth compression in chipkill-correct memory architectures is disclosed. In this regard, a compressed memory controller (CMC) introduces a specified error pattern into chipkill-correct error correcting code (ECC) bits to indicate compressed data. To encode data, the CMC applies a compression algorithm to an uncompressed data block to generate a compressed data block. The CMC then generates ECC data for the compressed data block (i.e., an "inner" ECC segment), appends the inner ECC segment to the compressed data block, and generates ECC data for the compressed data block and the inner ECC segment (i.e., an "outer" ECC segment). The CMC then intentionally inverts a specified plurality of bytes of the outer ECC segment (e.g., in portions of the outer ECC segment stored in different physical memory chips by a chipkill-correct ECC mechanism). The outer ECC segment is then appended to the compressed data block and the inner ECC segment.

24 Claims, 10 Drawing Sheets

(51) Int. Cl.
*G06F 3/06* (2006.01)
*H03M 7/30* (2006.01)
*G06F 11/10* (2006.01)

(52) U.S. Cl.
CPC .......... *G06F 3/0619* (2013.01); *G06F 3/0659* (2013.01); *G06F 3/0673* (2013.01); *G06F 11/1012* (2013.01); *G11C 29/52* (2013.01); *H03M 7/6041* (2013.01); *G11C 2207/102* (2013.01)

(58) Field of Classification Search
CPC .. G06F 3/0619; G06F 11/1012; G06F 3/0659; G06F 3/0673; G06F 3/064; G11C 29/52; G11C 2207/102; H03M 7/6041; H03M 13/6312; G01R 31/31921
USPC .......................................... 714/763, 752, 755
See application file for complete search history.

(56) References Cited

U.S. PATENT DOCUMENTS

| | | | |
|---|---|---|---|
| 7,500,157 B2 | 3/2009 | Kim et al. | |
| 8,533,550 B2 | 9/2013 | Khan | |
| 8,560,926 B2 * | 10/2013 | Yeh | G06F 12/0246 365/185.33 |
| 9,030,771 B2 | 5/2015 | Hostetter | |
| 9,767,070 B2 * | 9/2017 | Chang | G06F 15/7803 |
| 2007/0198626 A1 * | 8/2007 | Toda | G06F 11/1068 708/492 |
| 2011/0113115 A1 * | 5/2011 | Chang | G06F 15/7803 709/213 |
| 2011/0154158 A1 * | 6/2011 | Yurzola | G06F 11/1048 714/758 |
| 2011/0320915 A1 * | 12/2011 | Khan | G06F 3/0608 714/773 |
| 2013/0145207 A1 * | 6/2013 | Resnick | G06F 11/1004 714/6.2 |
| 2015/0019834 A1 * | 1/2015 | Loh | G06F 12/023 711/208 |
| 2015/0067436 A1 | 3/2015 | Hu et al. | |
| 2015/0146785 A1 * | 5/2015 | Bates | H04N 19/423 375/240.16 |
| 2015/0339228 A1 * | 11/2015 | Heddes | G06F 12/0802 711/3 |
| 2016/0139988 A1 | 5/2016 | Muralimanohar et al. | |

OTHER PUBLICATIONS

Co-pending U.S. Appl. No. 14/857,491, filed Sep. 17, 2015.
International Search Report and Written Opinion for PCT/US2017/047537, dated Nov. 22, 2017, 16 pages.
Kim, Jungrae et al., "Frugal ECC: Efficient and Versatile Memory Error Protection through Fine-Grained Compression," SC15: International Conference for High Performance Computing, Networking, Storage, and Analysis, ACM, Nov. 15, 2015, 12 pages.

* cited by examiner

PROVIDING MEMORY BANDWIDTH COMPRESSION IN CHIPKILL-CORRECT MEMORY ARCHITECTURES

BACKGROUND

I. Field of the Disclosure

The technology of the disclosure relates generally to memory bandwidth compression, and, in particular, to memory bandwidth compression in memory architectures supporting a chipkill-correct error correcting code (ECC) mechanism.

II. Background

As applications executing in a processor-based system increase in terms of complexity and resource requirements, a lack of available memory bandwidth may impose a constraint on system performance. If accesses to an external memory reach memory bandwidth limits, a memory controller of the processor-based system may be forced to queue memory access requests. Such queueing of memory access requests may increase the latency of memory accesses, which in turn may have a negative impact on the performance of the processor-based system.

To address this issue, memory bandwidth compression schemes may be employed to achieve memory bandwidth savings by reducing the bandwidth consumed by a given memory access. Some memory bandwidth compression schemes make use of compression indicators (CIs) that explicitly indicate a compression status of a corresponding memory block that is read from or written to in a system memory. For ease of access, the CIs may be kept in a memory area that is conventionally utilized by an error correcting code (ECC) mechanism as a storage area for ECC data words used for error detection and correction.

Some memory architectures employ what is known as a chipkill-correct ECC mechanism for providing error correction. A chipkill-correct ECC mechanism provides the ability to detect and correct the failure of multiple bits within a memory device by distributing bits of ECC data words across multiple physical memory chips, such that the failure of any single memory chip affects only a subset of the ECC bits per data word. Such chipkill-correct ECC mechanism may enable memory contents to be reconstructed despite a complete failure of one memory chip. However, the chipkill-correct ECC mechanism may also require the use of stronger ECC protection schemes that may consume more of the ECC storage area in which a CI can otherwise be kept. Thus, an alternative mechanism for providing an indication of compression status of a given memory block is desirable when using a memory architecture providing a chipkill-correct ECC mechanism.

SUMMARY OF THE DISCLOSURE

Aspects disclosed in the detailed description include providing memory bandwidth compression in chipkill-correct memory architectures. In some aspects, a compressed memory controller (CMC) is configured to implicitly store a value of a compression indicator (CI) by introducing, and subsequently detecting, a specified error pattern into chipkill-correct error correcting code (ECC) bits to indicate a presence of compressed data. To encode data to be written to a system memory, the CMC first applies a compression algorithm to an uncompressed data block to generate a compressed data block. The size of the compressed data block is compared to a compression threshold to determine whether the data within the uncompressed data block was sufficiently compressed. If so, the CMC generates ECC data for the compressed data block (i.e., an "inner" ECC segment). The CMC appends the inner ECC segment to the compressed data block, and generates ECC data for the compressed data block and the inner ECC segment (i.e., an "outer" ECC segment). The CMC then intentionally induces an error in the outer ECC segment by inverting a specified plurality of bytes. For example, the specified plurality of bytes may be selected to be bytes that are stored across multiple lanes and multiple different physical memory devices by a chipkill-correct ECC mechanism of the system memory. The outer ECC segment is then appended to the compressed data block and the inner ECC segment, and stored in the system memory as an output code word.

To decode an input code word, the CMC first determines whether the outer ECC segment of the input code word indicates an error. If not, the CMC treats the input code word as containing uncompressed data. If the outer ECC segment of the input code word indicates an error, the CMC inverts the specified plurality of bytes in the outer ECC segment, and then determines whether the outer ECC segment with the inverted bytes indicates an error. If not, the CMC processes the input code word as containing compressed data. If the outer ECC segment still indicates an error after the specified plurality of bytes are inverted, the CMC concludes that the compression status of the input code word is unknown. Accordingly, some aspects of the CMC may read a CI from a master table in system memory, and processes the input code word according to the compression status indicated by the CI. If the CI indicates that the input code word is compressed, the CMC decodes a data segment of the input code word as the compressed data, and uses the inner ECC segment for error checking. If the CI indicates that the input code word is not compressed, the CMC decodes the data segment and the inner ECC segment as the uncompressed data, and uses the outer ECC segment for error checking.

In another aspect, a CMC is provided. The CMC includes a memory interface configured to access a system memory via a system bus. The system memory is configured to employ a chipkill-correct ECC mechanism. The CMC is configured to receive a memory write request including an uncompressed data block. The CMC is further configured to generate a compressed data block based on the uncompressed data block. The CMC is also configured to determine whether a size of the compressed data block exceeds a compression threshold. The CMC is additionally configured to, responsive to determining that a size of the compressed data block exceeds a compression threshold, generate an outer ECC segment based on the uncompressed data block. The CMC is further configured to output, to the system memory, an output code word including a data segment containing the uncompressed data block and the outer ECC segment. The CMC is also configured to, responsive to determining that a size of the compressed data block does not exceed a compression threshold, generate an inner ECC segment based on the compressed data block. The CMC is additionally configured to generate an outer ECC segment based on the compressed data block and the inner ECC segment. The CMC is further configured to invert a specified plurality of bytes of the outer ECC segment. The CMC is also configured to output, to the system memory, the output code word including the data segment containing the compressed data block, the inner ECC segment, and the outer ECC segment.

In another aspect, a method for providing memory bandwidth compression for a system memory configured to employ a chipkill-correct ECC mechanism is provided. The method includes receiving, by a CMC, a memory write request including an uncompressed data block. The method further includes generating a compressed data block based on the uncompressed data block. The method also includes determining whether a size of the compressed data block exceeds a compression threshold. The method additionally includes, responsive to determining that a size of the compressed data block exceeds a compression threshold, generating an outer ECC segment based on the uncompressed data block. The method further includes outputting, to the system memory, an output code word including a data segment containing the uncompressed data block and the outer ECC segment. The method also includes, responsive to determining that a size of the compressed data block does not exceed a compression threshold, generating an inner ECC segment based on the compressed data block. The method additionally includes generating an outer ECC segment based on the compressed data block and the inner ECC segment. The method further includes inverting a specified plurality of bytes of the outer ECC segment. The method also includes outputting, to the system memory, the output code word including the data segment containing the compressed data block, the inner ECC segment, and the outer ECC segment.

In another aspect, a CMC for providing memory bandwidth compression for a system memory configured to employ a chipkill-correct ECC mechanism is provided. The CMC includes a means for receiving a memory write request including an uncompressed data block. The CMC further includes a means for generating a compressed data block based on the uncompressed data block. The CMC also includes a means for determining whether a size of the compressed data block exceeds a compression threshold. The CMC additionally includes a means for generating an outer ECC segment based on the uncompressed data block, responsive to determining that a size of the compressed data block exceeds a compression threshold. The CMC further includes a means for outputting, to the system memory, an output code word including a data segment containing the uncompressed data block and the outer ECC segment. The CMC also includes a means for generating an inner ECC segment based on the compressed data block, responsive to determining that a size of the compressed data block does not exceed a compression threshold. The CMC additionally includes a means for generating an outer ECC segment based on the compressed data block and the inner ECC segment. The CMC further includes a means for inverting a specified plurality of bytes of the outer ECC segment. The CMC also includes a means for outputting, to the system memory, the output code word including the data segment containing the compressed data block, the inner ECC segment, and the outer ECC segment.

In another aspect, a non-transitory computer-readable medium, having stored thereon computer executable instructions, is provided. The computer executable instructions, when executed by a processor, cause the processor to receive a memory write request including an uncompressed data block. The computer executable instructions further cause the processor to generate a compressed data block based on the uncompressed data block. The computer executable instructions also cause the processor to determine whether a size of the compressed data block exceeds a compression threshold. The computer executable instructions additionally cause the processor to, responsive to determining that a size of the compressed data block exceeds a compression threshold, generate an outer ECC segment based on the uncompressed data block. The computer executable instructions further cause the processor to output, to a system memory, an output code word including a data segment containing the uncompressed data block and the outer ECC segment. The computer executable instructions also cause the processor to, responsive to determining that a size of the compressed data block does not exceed a compression threshold, generate an inner ECC segment based on the compressed data block. The computer executable instructions additionally cause the processor to generate an outer ECC segment based on the compressed data block and the inner ECC segment. The computer executable instructions further cause the processor to invert a specified plurality of bytes of the outer ECC segment. The computer executable instructions also cause the processor to output, to the system memory, the output code word including the data segment containing the compressed data block, the inner ECC segment, and the outer ECC segment.

DETAILED DESCRIPTION

Figure 1:
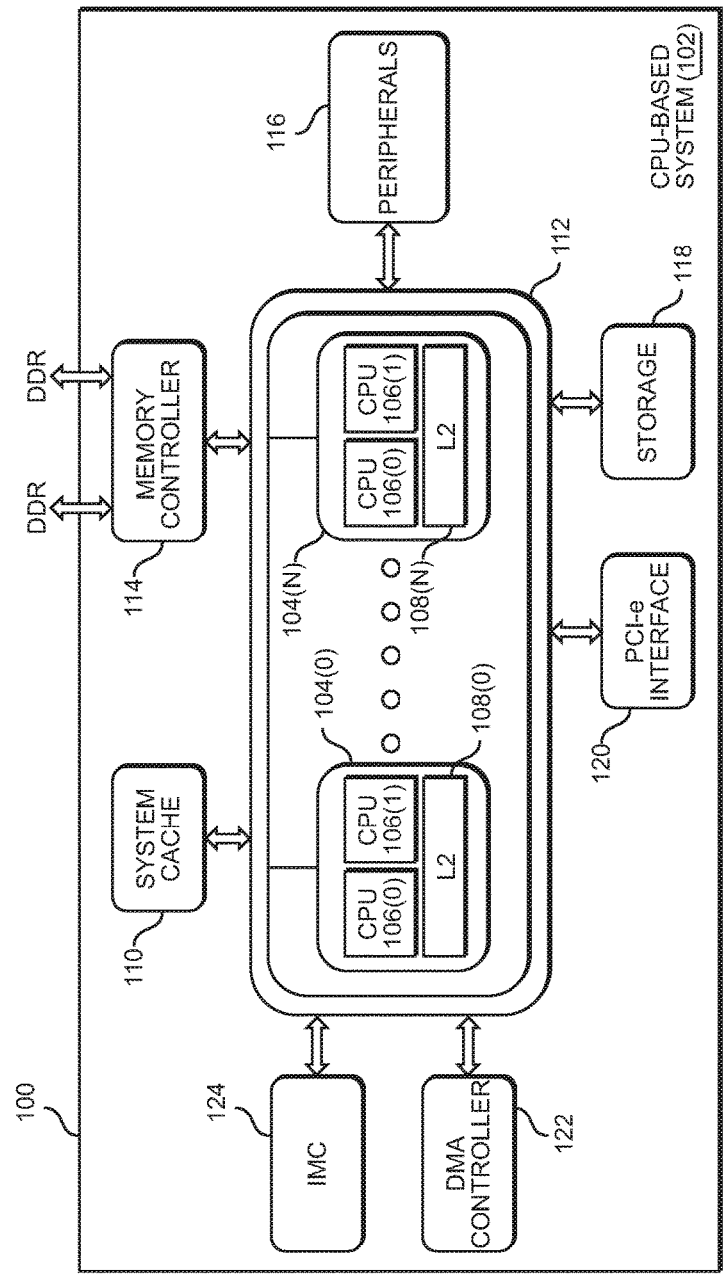
FIG. 1 is a schematic diagram of an exemplary system-on-a-chip (SoC) that includes a central processing unit (CPU)-based system.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include providing memory bandwidth compression in chipkill-correct memory architectures. In some aspects, a compressed memory controller (CMC) is configured to provide memory bandwidth compression by implicitly storing a value of a compression indicator (CI) as a specified error pattern in chipkill-correct error correcting code (ECC) bits to indicate a presence of compressed data. Before describing functionality of the CMC in greater detail, elements and operations of a conventional central processor unit (CPU)-based system in which the CMC may be provided are first discussed.

In this regard, FIG. 1 provides a schematic diagram of an exemplary system-on-a-chip (SoC) 100 that includes a CPU-based system 102. The CPU-based system 102 includes a plurality of CPU blocks 104(0)-104(N) in this example, wherein 'N' is equal to any number of CPU blocks desired. In the example of FIG. 1, each of the plurality of CPU blocks 104(0)-104(N) contains two (2) CPUs 106(0) and 106(1). The plurality of CPU blocks 104(0)-104(N) further contain shared Level 2 (L2) caches 108(0)-108(N), respectively. A system cache 110 (e.g., a Level 3 (L3) cache) is also provided for storing cached data that is used by any of, or shared among, each of the plurality of CPU blocks 104(0)-104(N). An internal system bus 112 is provided to enable each of the plurality of CPU blocks 104(0)-104(N) to access the system cache 110 as well as other shared resources. Other shared resources accessed by the plurality of CPU blocks 104(0)-104(N) through the internal system bus 112 may include a memory controller 114 for accessing a main, external memory (e.g., double data rate (DDR) dynamic random access memory (DRAM), as a non-limiting example), peripherals 116, other storage 118, an express peripheral component interconnect (PCI) (PCI-e) interface 120, a direct memory access (DMA) controller 122, and/or an integrated memory controller (IMC) 124.

As CPU-based applications executing in the CPU-based system 102 of FIG. 1 increase in complexity and resource requirements, limitations on memory bandwidth may impose performance constraints on the CPU-based system 102. If accesses to external memory reach memory bandwidth limits, the memory controller 114 of the CPU-based system 102 may be forced to queue memory access requests. Such queueing of memory access requests may increase the latency of memory accesses, which in turn may decrease the performance of the CPU-based system 102.

Figure 2:
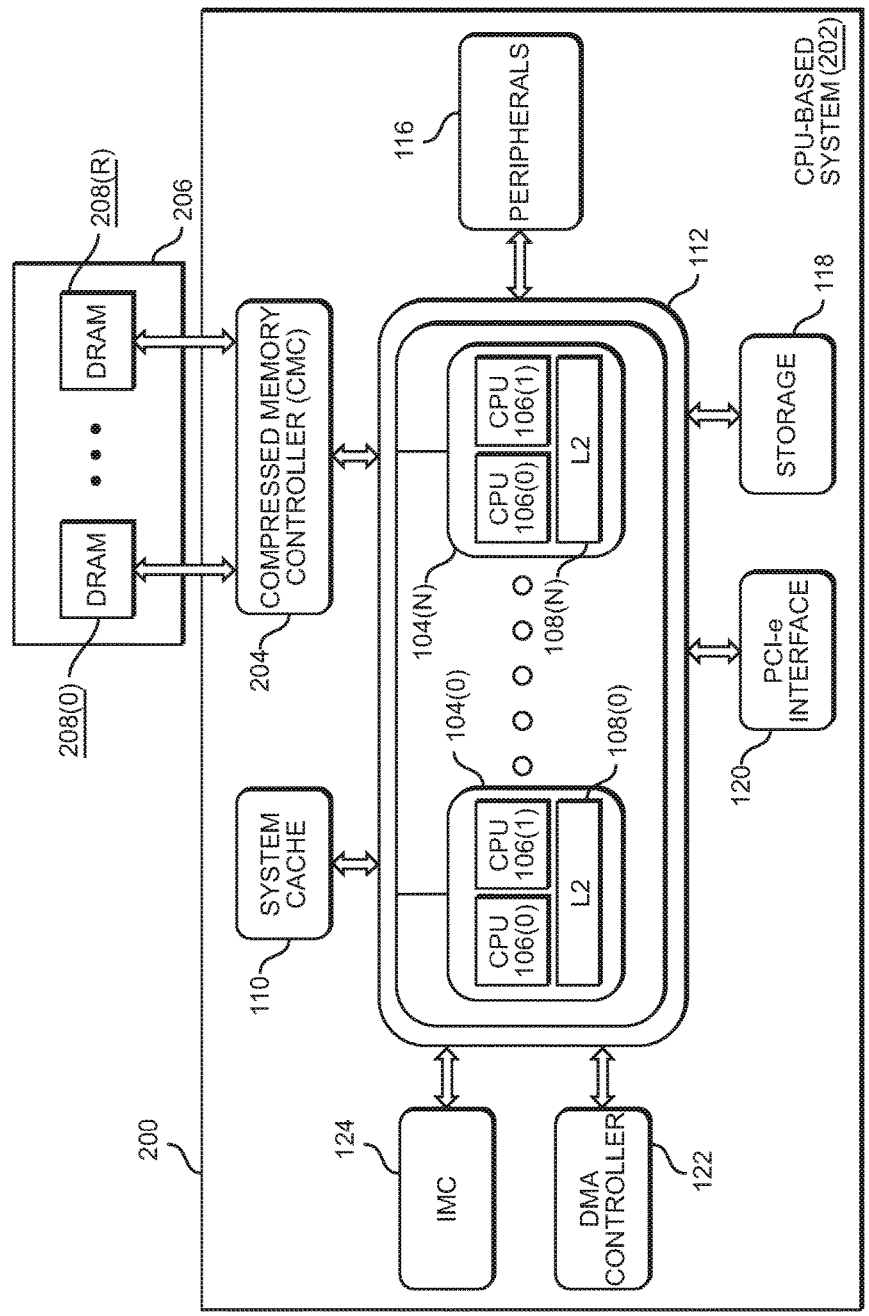
FIG. 2 is a schematic diagram of an SoC that includes an exemplary CPU-based system having a plurality of CPUs and a compressed memory controller (CMC) configured to provide memory bandwidth compression.

In some aspects, a compressed memory controller (CMC) is configured to provide memory bandwidth compression for memory read requests and/or memory write requests. In this regard, FIG. 2 is a schematic diagram of a SoC 200 that includes a CPU-based system 202 having the plurality of CPU blocks 104(0)-104(N) similar to the CPU-based system 102 of FIG. 1. The CPU-based system 202 of FIG. 2 includes some common components with the CPU-based system 102 in FIG. 1, which are noted by common element numbers between FIGS. 1 and 2. For the sake of brevity, these elements will not be re-described. However, in the CPU-based system 202 of FIG. 2, a CMC 204 is provided. The CMC 204 controls access to a system memory 206. The system memory 206 may include one or more DDR DRAMs 208(0)-208(R) (referred to hereinafter as "DRAM 208(0)-208(R)"), as a non-limiting example. The CMC 204 in this example employs memory bandwidth compression according to the aspects disclosed herein and below. Similar to the memory controller 114 of the CPU-based system 102 of FIG. 1, the CMC 204 in the CPU-based system 202 of FIG. 2 is shared by the plurality of CPU blocks 104(0)-104(N) through the internal system bus 112.

Figure 3:
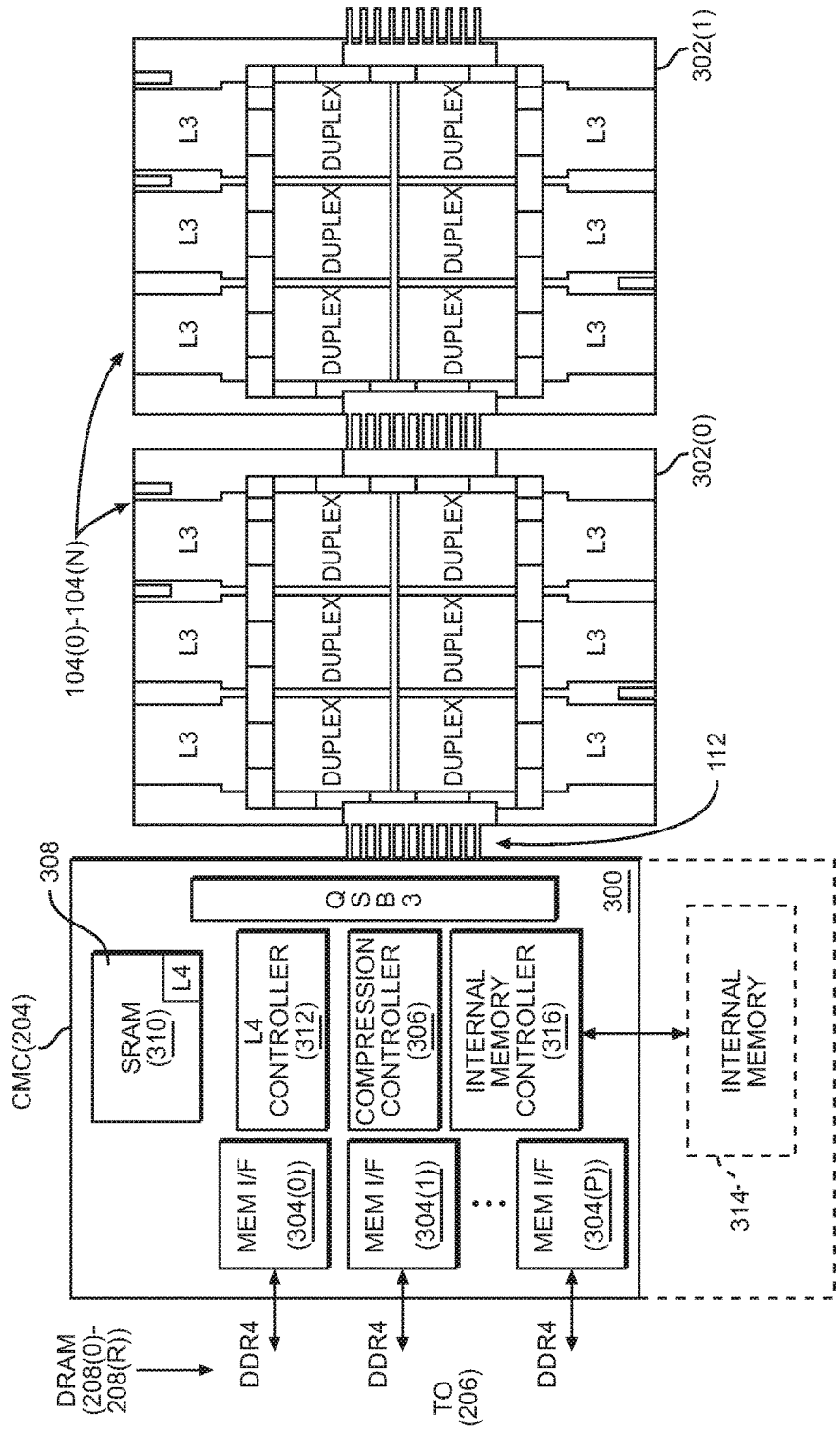
FIG. 3 is a more detailed schematic diagram of the CMC of FIG. 2, wherein the CMC is further communicatively coupled to an optional, internal memory that may be employed to provide memory bandwidth compression.

To illustrate, a more detailed schematic diagram of exemplary internal components of the CMC 204 of FIG. 2 is provided in FIG. 3. In this example, the CMC 204 is provided on a separate semiconductor die 300 from semiconductor dies 302(0) and 302(1) that contain the plurality of CPU blocks 104(0)-104(N) of FIG. 2. Alternatively, in some aspects, the CMC 204 may be included in a common semiconductor die (not shown) with the plurality of CPU blocks 104(0)-104(N). Regardless of the die configurations, the CMC 204 is provided such that the plurality of CPU blocks 104(0)-104(N) may make memory access requests via the internal system bus 112 to the CMC 204, and receive data from memory through the CMC 204.

With continuing reference to FIG. 3, the CMC 204 controls operations for memory accesses to the system memory 206, which is shown in FIGS. 2 and 3 as including the DRAM 208(0)-208(R). The CMC 204 includes a plurality of memory interfaces (MEM I/Fs) 304(0)-304(P) (e.g., DDR DRAM interfaces) used to service memory access requests (not shown). In this regard, the CMC 204 in this example includes a compression controller 306. The compression controller 306 controls compression of data stored to the system memory 206 and decompression of data retrieved from the system memory 206 in response to memory access requests from the plurality of CPU blocks 104(0)-104(N). The compression controller 306 can also be configured to perform bandwidth compression of information provided over the internal system bus 112 to the plurality of CPU blocks 104(0)-104(N).

The compression controller 306 can perform any number of compression techniques and algorithms to provide memory bandwidth compression. A local memory 308 is provided for data structures and other data storage needed by the compression controller 306 to perform such compression techniques and algorithms. In this regard, the local memory 308 is provided in the form of a static random access memory (SRAM) 310. The local memory 308 is of sufficient size to be used for data structures and other data storage that may be needed for the compression controller 306 to perform compression techniques and algorithms. The local memory 308 may also be partitioned to contain a cache, such as a Level 4 (L4) cache, to provide additional cache memory for internal use within the CMC 204. Thus, an L4 controller 312 may also be provided in the CMC 204 to provide access to the L4 cache. Enhanced compression techniques and algorithms may require a larger internal memory. For example, the local memory 308 may provide 128 kilobytes (kB) of memory.

Further, as shown in FIG. 3, an optional, additional internal memory 314 can also be provided for the CMC 204. The additional internal memory 314 may be provided as DRAM, as an example. The additional internal memory 314 can facilitate additional or greater amounts of storage of data structures and other data than in the local memory 308 for the CMC 204 providing memory bandwidth compression and decompression mechanisms to increase the memory bandwidth compression of the CPU-based system 202. An internal memory controller 316 is provided in the CMC 204 to control memory accesses to the additional internal memory 314 for use in compression. The internal memory controller 316 is not accessible or viewable to the plurality of CPU blocks 104(0)-104(N).

Each of the resources provided for memory bandwidth compression in the CMC 204 of FIG. 3, including the local memory 308 and the additional internal memory 314, can be used individually or in conjunction with each other to achieve the desired balance among resources and area, power consumption, increased memory capacity through memory capacity compression, and increased performance through memory bandwidth compression. Memory bandwidth compression can be enabled or disabled, as desired. Further, the resources described above for use by the CMC 204 can be enabled or disabled to achieve the desired tradeoffs among memory capacity and/or bandwidth compression efficiency, power consumption, and performance. Exemplary memory bandwidth compression techniques using these resources available to the CMC 204 will now be discussed.

In some aspects, the CMC 204 may make use of compression indicators (CIs) that explicitly indicate a compression status of a corresponding memory block that is read from or written to in a system memory. The CIs may be kept in memory areas that are conventionally utilized by an ECC mechanism of the system memory 206 to store ECC data words used for error detection and correction. However, some aspects of the system memory 206 may employ a chipkill-correct ECC mechanism that consumes more of the storage area in which a CI may otherwise be kept. Thus, an alternative mechanism for providing an indication of compression status of a given memory block is desirable when the system memory 206 is based on a memory architecture providing a chipkill-correct ECC mechanism.

Figure 4:
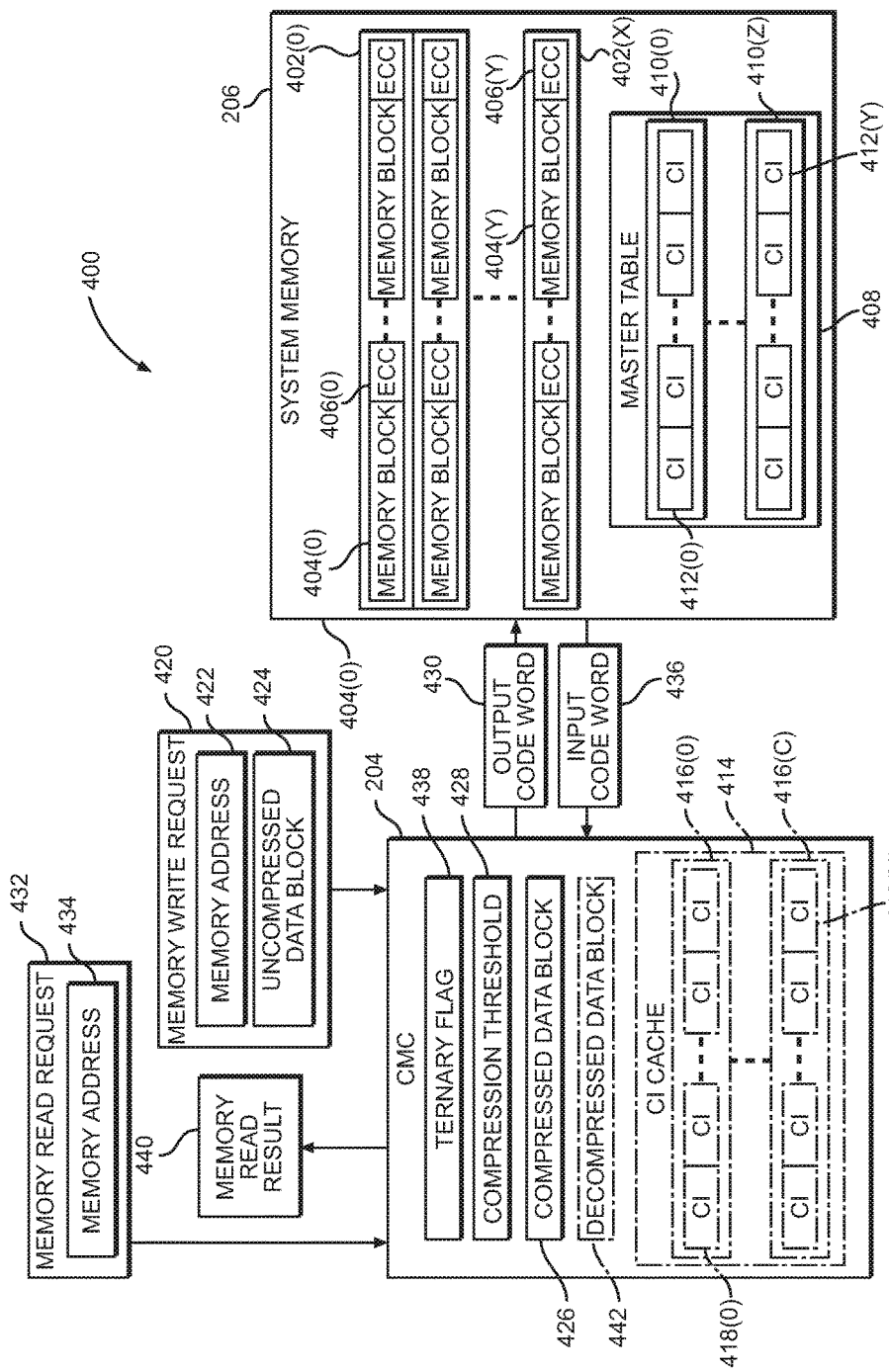
FIG. 4 is a diagram illustrating an exemplary memory bandwidth compression mechanism that may be implemented by the CMC of FIGS. 2 and 3 for providing memory bandwidth compression for chipkill-correct memory architectures.

In this regard, FIG. 4 illustrates an exemplary memory bandwidth compression mechanism 400 that can be implemented by the CMC 204 of FIGS. 2 and 3 to provide memory bandwidth compression. In the memory bandwidth compression mechanism 400, the system memory 206 includes a plurality of memory lines 402(0)-402(X) for storing compressed and uncompressed data. The plurality of memory lines 402(0)-402(X) are each subdivided into respective memory blocks 404(0)-404(Y), as determined by an underlying memory architecture of the system memory 206. In some aspects, the size of each of the memory blocks 404(0)-404(Y) represents a smallest amount of data that may be read from the system memory 206 in a memory read operation. For example, in some exemplary memory architectures, each of the plurality of memory lines 402(0)-402(X) may include 128 bytes of data, subdivided into two 64-byte memory blocks 404(0)-404(Y). Some aspects may provide that each of the plurality of memory lines 402(0)-402(X) may include more or fewer bytes of data (e.g., 256 bytes or 64 bytes, as non-limiting examples). Similarly, according to some aspects, the memory blocks 404(0)-404(Y) within the plurality of memory lines 402(0)-402(X) may be larger or smaller (e.g., 128 bytes or 32 bytes, as non-limiting examples). In some aspects, a memory read operation may read fewer bytes than the size of each of the memory blocks 404(0)-404(Y), but still consume the same amount of memory bandwidth as one of the memory blocks 404(0)-404(Y).

Each of the memory blocks 404(0)-404(Y) is associated with one or more corresponding ECC areas 406(0)-406(Y). ECC areas such as the ECC areas 406(0)-406(Y) are used conventionally to detect and correct commonly encountered types of internal data corruption within the memory blocks 404(0)-404(Y). As a non-limiting example, the ECC areas 406(0)-406(Y) may be employed by a Reed Solomon ECC mechanism that uses a symbol size of eight (8) bits. Although the ECC areas 406(0)-406(Y) in FIGS. 6A and 6B are depicted as being adjacent to their respective memory blocks 404(0)-404(Y), it is to be understood that the ECC areas 406(0)-406(Y) may be located elsewhere within the system memory 206.

The system memory 206 also provides a master table 408 that stores a plurality of master table entries 410(0)-410(Z). Each of the plurality of master table entries 410(0)-410(Z) may be a same size as the plurality of memory lines 402(0)-402(X), and stores one or more CIs 412(0)-412(Y). The one or more CIs 412(0)-412(Y) each may include one or more bits that indicate a compression status of data stored at a corresponding memory block of the memory blocks 404(0)-404(Y) of the system memory 206. In some aspects, each of the one or more CIs 412(0)-412(Y) may include a single bit indicating whether data in the corresponding memory block is compressed or uncompressed. According to some aspects, each of the one or more CIs 412(0)-412(Y) may include multiple bits that may be used to indicate a compression pattern (e.g., a number of the memory blocks 404(0)-404(Y) occupied by the compressed data, as a non-limiting example) for each of the corresponding memory blocks 404(0)-404(Y).

In some aspects, the CMC 204 may provide a CI cache 414 including a plurality of CI cache entries 416(0)-416(C) for caching a subset of the plurality of master table entries 410(0)-410(Z) of the master table 408. The plurality of CI cache entries 416(0)-416(C) store cached CIs 418(0)-418(N) that were previously read, and that may be accessed again by the CMC 204. Using the CI cache 414, the CMC 204 may reduce memory access latency that may be incurred by reading the master table 408 in the system memory 206.

To provide memory bandwidth compression, the CMC 204 may receive a memory write request 420 that includes a memory address 422 and an uncompressed data block 424. The CMC 204 applies a compression algorithm to the uncompressed data block 424 to generate a compressed data block 426, and compares a size of the compressed data block 426 to a compression threshold 428 that specifies a maximum size for compressed data. Some aspects may provide that the compression threshold 428 may correspond to a size of an uncompressed data segment minus a size of an inner ECC segment. For example, if an uncompressed data segment is 32 bytes and four (4) bytes are used to store an inner ECC segment, the compression threshold 428 may be set to a value of 28. If the size of the compressed data block 426 exceeds the compression threshold 428, the CMC 204 essentially treats the uncompressed data block 424 as not compressible, and generates an output code word 430 using the uncompressed data block 424 and ECC data (not shown) for the uncompressed data block 424. The output code word 430 is then stored in the system memory 206. The composition of the output code word 430 when storing the uncompressed data block 424 is illustrated in greater detail below in FIG. 5A.

If the size of the compressed data block 426 does not exceed the compression threshold 428 (i.e., the compressed data block 426 has been sufficiently compressed), the CMC 204 generates an inner ECC segment (not shown) based on the compressed data block 426 to store error correcting data for the compressed data block 426. The CMC 204 subsequently generates an outer ECC segment (not shown) based on the compressed data block 426 with the inner ECC segment appended, to store error correcting data for the compressed data block 426 and the inner ECC segment. To indicate that the compressed data block 426 was successfully compressed, the CMC 204 inverts a specified plurality of bytes (not shown) of the outer ECC segment. As described in greater detail below with respect to FIG. 5B, the inverted plurality of bytes represent an implicit CI indicating the presence of compressed data, and are selected so that the likelihood of all of the bits in the specified plurality of bytes being naturally corrupted is low. For example, the specified plurality of bytes may be selected to be bytes that are stored across multiple lanes and multiple different physical memory devices by the chipkill-correct ECC mechanism of the system memory 206. In some aspects, the multiple lanes across which the specified plurality of bytes are stored may include four (4) lanes, and the multiple different physical memory devices across which the specified plurality of bytes are stored may include two (2) memory devices (e.g., memory chips). The CMC 204 generates the output code word 430 using the compressed data block 426, the inner ECC segment, and the outer ECC segment, and the output code word 430 is stored in the system memory 206.

According to some aspects, the CMC 204 may also receive a memory read request 432 including a memory address 434 of data to read from the system memory 206. The CMC 204 may retrieve an input code word 436 from the memory address 434 of the system memory 206 in response to the memory read request 432. Because the input code word 436 may contain either uncompressed data or compressed data, the CMC 204 performs a series of operations to attempt to determine a compression status of the input code word 436. The CMC 204 first examines the outer ECC segment (not shown) of the input code word 436 to determine whether an error is indicated. If not, the CMC 204 may conclude that the input code word 436 contains uncompressed data (not shown) and that no error is present, and generates a ternary flag 438 indicating that the input code word 436 has a compression status of "uncompressed." Based on the ternary flag 438, the CMC 204 may return the uncompressed data of the input code word 436 as a memory read result 440.

However, if the outer ECC segment indicates an error, it is possible that the input code word 436 contains an actual, naturally occurring data error, or it is possible that the input code word 436 contains compressed data. To distinguish between these possibilities, the CMC 204 inverts the specified plurality of bytes of the outer ECC segment, and examines the outer ECC segment with the inverted plurality of bytes to determine whether an error is indicated. If no error is indicated by the outer ECC segment with the inverted plurality of bytes, the CMC 204 may conclude that a previous error was intentionally introduced during compression of the input code word 436, and thus the input code word 436 contains compressed data. The CMC 204 then generates the ternary flag 438 indicating that the input code word 436 has a compression status of "compressed." Based on the ternary flag 438, the CMC 204 may generate a decompressed data block 442 based on the input code word 436. The decompressed data block 442 may then be returned as the memory read result 440.

If the outer ECC segment with the inverted plurality of bytes still indicates an error, then the CMC 204 concludes that the input code word 436 has an unknown compression status. Accordingly, the CMC 204 may generate the ternary flag 438 indicating that the input code word 436 has the unknown compression status. The CMC 204 may then read one of the cached CIs 418(0)-418(N) for the memory address 434 of the input code word 436 from the CI cache 414, and/or may read one of the one or more CIs 412(0)-412(Y) for the memory address 434 of the input code word 436 from the master table 408. The CMC 204 processes the input code word 436 according to the CI of the cached CIs 418(0)-418(N) or the one or more CIs 412(0)-412(Y).

Figure 5A:
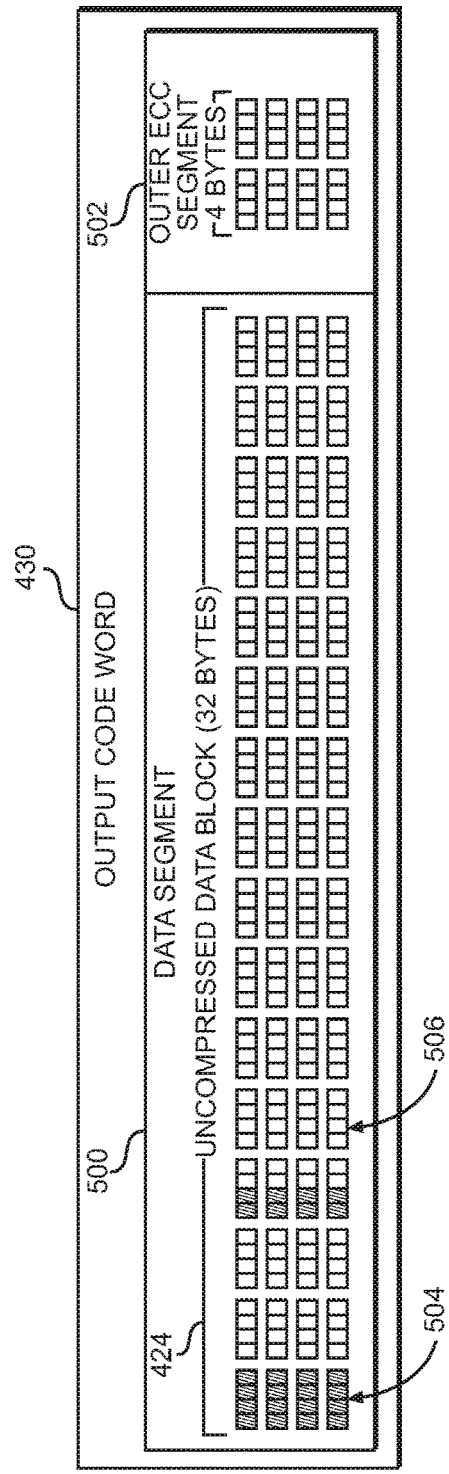
FIGS. 5A and 5B are block diagrams illustrating an organization of contents of an output data block containing uncompressed data and compressed data, respectively, as generated by the CMC of FIGS. 2-4 to be stored in a system memory.
Figure 5B:
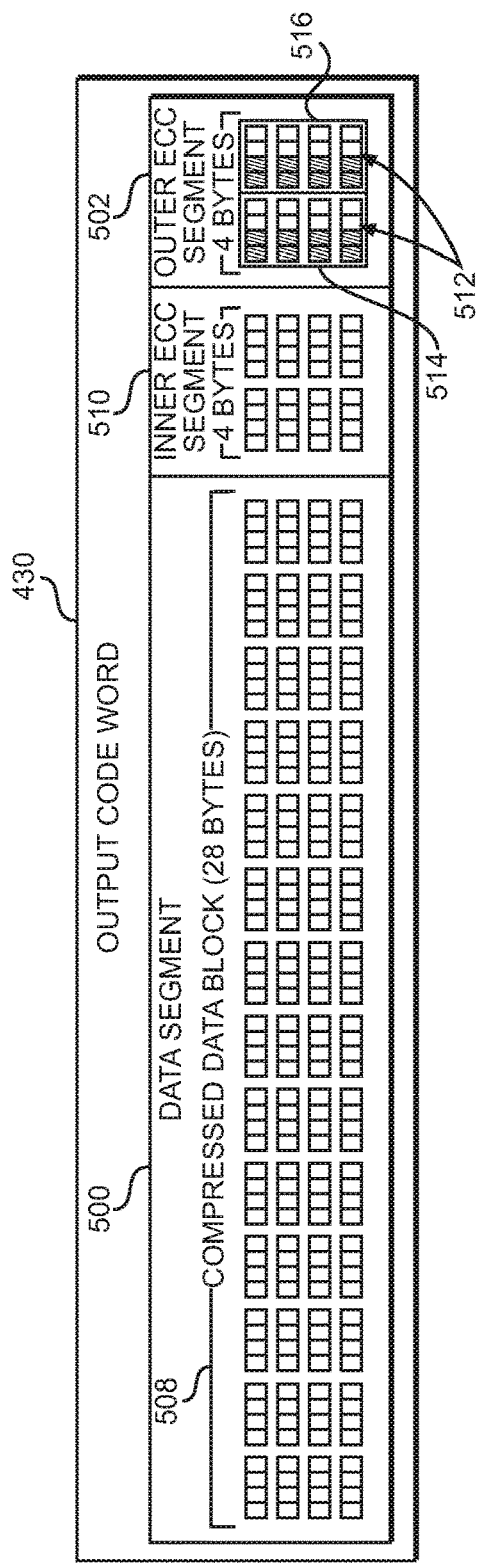

To illustrate in greater detail the composition of the output code word 430 generated by the CMC 204 when encoding uncompressed and compressed data, FIGS. 5A and 5B are provided. In FIG. 5A, the output code word 430 generated by the CMC 204 after encoding the uncompressed data block 424 is shown. The output code word 430 in the example of FIG. 5A includes a data segment 500 of 32 bytes, in which the uncompressed data block 424 is stored, and an outer ECC segment 502 of four (4) bytes, for a total size of 36 bytes. The outer ECC segment 502 contains ECC data generated by the CMC 204, and in some aspects is stored in one of the ECC areas 406(0)-406(Y) of the system memory 206. To provide error detection and correction, the chipkill-correct ECC mechanism of the system memory 206 stores the 36 bytes of the output code word 430 across 18 separate memory devices, with each memory device storing two (2) bytes of eight (8) bits of the output code word 430. The shaded bits indicated by arrow 504 represent one such memory device, while the shaded bits indicated by arrow 506 represent one byte.

FIG. 5B shows the output code word 430 generated by the CMC 204 after encoding the compressed data block 426. In the example of FIG. 5B, the uncompressed data block 424 has been compressed into compressed data block 508, which is stored in the data segment 500 of 28 bytes. The CMC 204 then generates a four (4)-byte inner ECC segment 510 based on the data in the compressed data block 508. The outer ECC segment 502, also including four (4) bytes, is generated based on the compressed data block 508 and the inner ECC segment 510. The CMC 204 then inverts a specified plurality of bytes 512 of the outer ECC segment 502. As seen in FIG. 5B, the specified plurality of bytes 512 are selected such that they are stored on different memory devices 514 and 516 by the chipkill-correct ECC mechanism of the system memory 206.

Figure 6:
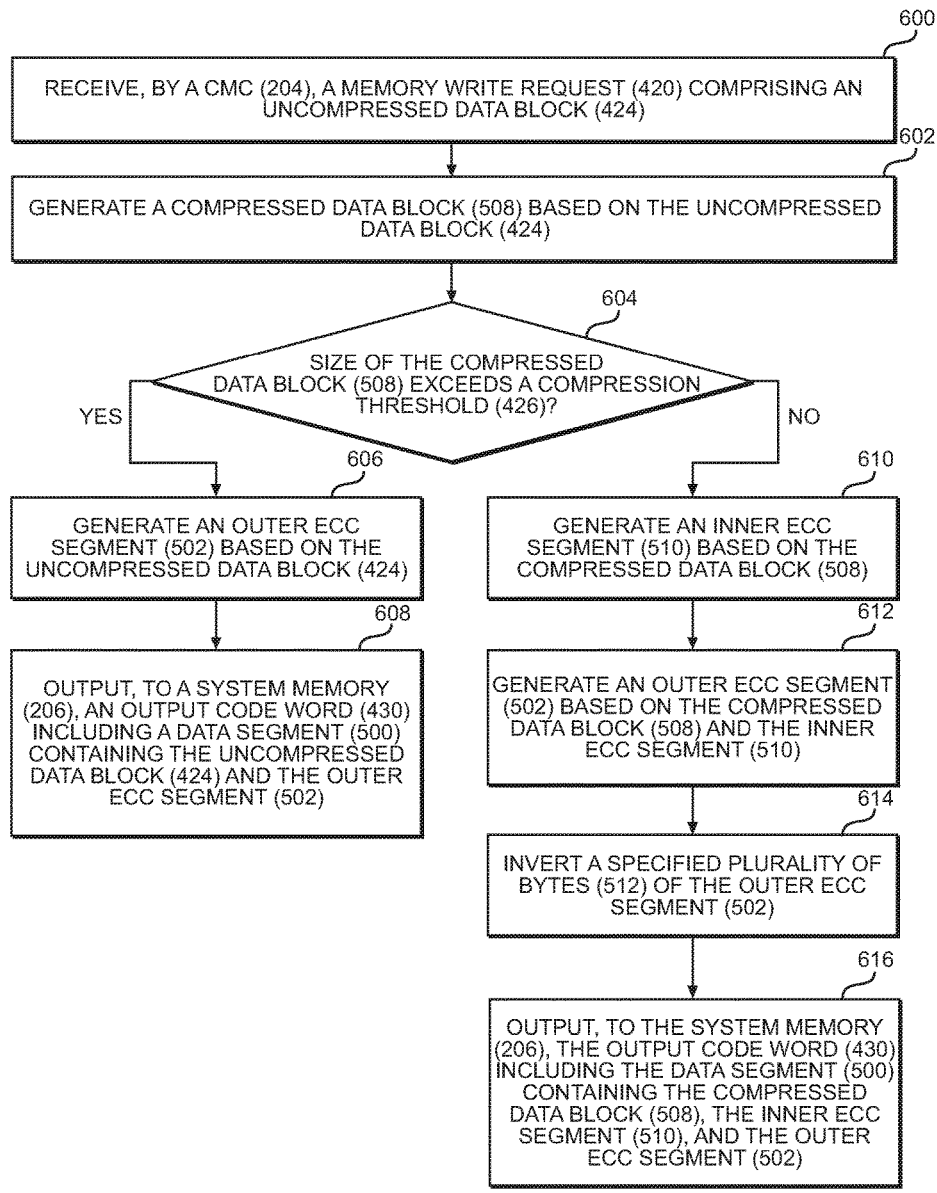
FIG. 6 is a flowchart illustrating exemplary operations for performing a memory write operation by the CMC of FIGS. 2-4 using memory bandwidth compression.

To illustrate exemplary operations of the CMC 204 of FIGS. 2-4 for encoding data to provide memory bandwidth compression for chipkill-correct memory architectures, FIG. 6 is provided. Elements of FIGS. 2-4, 5A, and 5B are referenced in describing FIG. 6 for the sake of clarity. In FIG. 6, operations begin with a CMC 204 receiving a memory write request 420 including an uncompressed data block 424 (block 600). In this regard, the CMC 204 may be referred to herein as "a means for receiving a memory write request comprising an uncompressed data block." The CMC 204 next generates a compressed data block 508 based on the uncompressed data block 424 (block 602). Accordingly, the CMC 204 may be referred to herein as "a means for generating a compressed data block based on the uncompressed data block." The CMC 204 then determines whether a size of the compressed data block 508 exceeds a compression threshold 428 (block 604). The CMC 204 thus may be referred to herein as "a means for determining whether a size of the compressed data block exceeds a compression threshold."

If the CMC 204 determines at decision block 604 that the size of the compressed data block 508 exceeds the compression threshold 428, the CMC 204 concludes that compression of the uncompressed data block 424 was not successful (i.e., the data within the uncompressed data block 424 could not be sufficiently compressed). Thus, the CMC 204 generates an outer ECC segment 502 based on the uncompressed data block 424 (block 606). In this regard, the CMC 204 may be referred to herein as "a means for generating an outer ECC segment based on the uncompressed data block, responsive to determining that a size of the compressed data block exceeds a compression threshold." The CMC 204 then outputs, to a system memory 206, an output code word 430 including a data segment 500 containing the uncompressed data block 424 and the outer ECC segment 502 (block 608). Accordingly, the CMC 204 may be referred to herein as "a means for outputting, to the system memory, an output code word comprising a data segment containing the uncompressed data block and the outer ECC segment."

However, if the CMC 204 determines at decision block 604 that the size of the compressed data block 508 does not exceed the compression threshold 428 (i.e., the data within the uncompressed data block 424 was sufficiently compressed), the CMC 204 generates an inner ECC segment 510 based on the compressed data block 508 (block 610). The CMC 204 thus may be referred to herein as "a means for generating an inner ECC segment based on the compressed data block, responsive to determining that a size of the compressed data block does not exceed a compression threshold." The CMC 204 also generates an outer ECC segment 502 based on the compressed data block 508 and the inner ECC segment 510 (block 612). In this regard, the CMC 204 may be referred to herein as "a means for generating an outer ECC segment based on the compressed data block and the inner ECC segment."

To indicate that compressed data is present, the CMC 204 inverts a specified plurality of bytes 512 of the outer ECC segment 502 (block 614). Accordingly, the CMC 204 may be referred to herein as "a means for inverting a specified plurality of bytes of the outer ECC segment." In some aspects, the specified plurality of bytes 512 that are inverted by the CMC 204 may include a plurality of bytes that are stored on different memory devices (e.g., different physical memory chips) of the system memory 206. The CMC 204 then outputs, to the system memory 206, the output code word 430 including the data segment 500 containing the compressed data block 508, the inner ECC segment 510, and the outer ECC segment 502 (block 616). The CMC 204 thus may be referred to herein as "a means for outputting, to the system memory, the output code word comprising the data segment containing the compressed data block, the inner ECC segment, and the outer ECC segment."

Figure 7A:
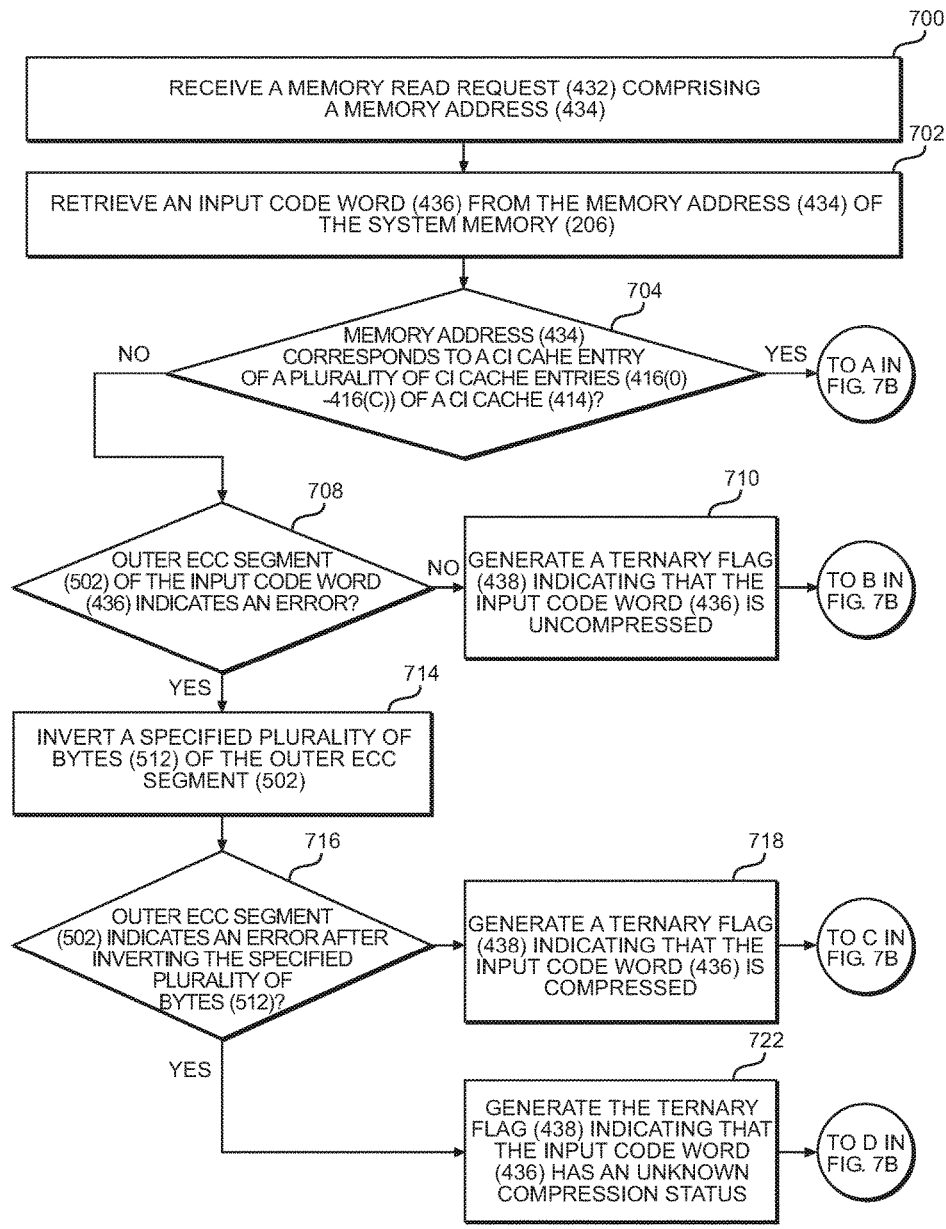
FIGS. 7A and 7B are flowcharts illustrating exemplary operations for performing a memory read operation by the CMC of FIGS. 2-4 using memory bandwidth compression.
Figure 7B:
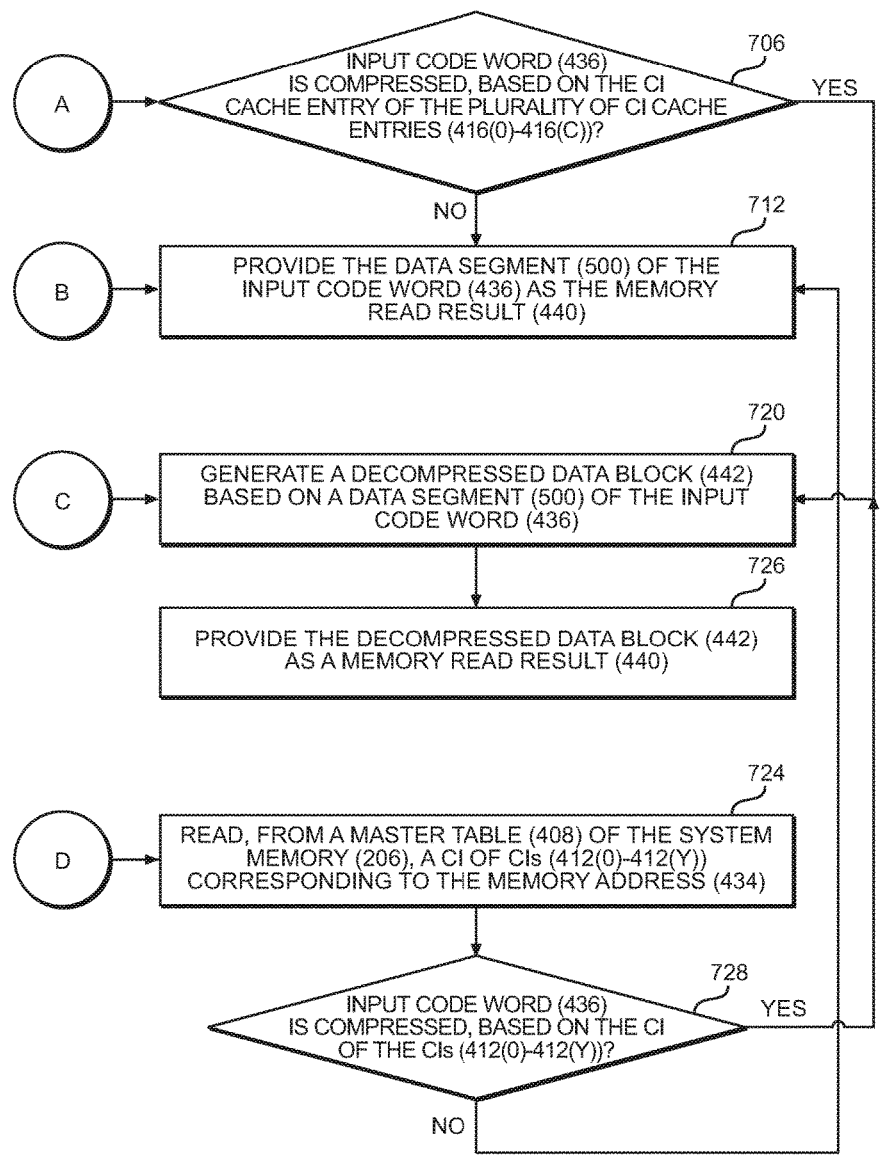

FIGS. 7A and 7B are provided to illustrate exemplary operations of the CMC 204 of FIGS. 2-4 for decoding data to provide memory bandwidth compression for chipkill-correct memory architectures. For the sake of clarity, elements of FIGS. 2-4, 5A, and 5B are referenced in describing FIGS. 7A and 7B. In FIG. 7A, operations begin with the CMC 204 receiving a memory read request 432 including a memory address 434 (block 700). In this regard, the CMC 204 may be referred to herein as "a means for receive a memory read request comprising a memory address." The CMC 204 retrieves an input code word 436 from the memory address 434 of the system memory 206 (block 702). Accordingly, the CMC 204 may be referred to herein as "a means for retrieving an input code word from the memory address of the system memory."

In some aspects, the CMC 204 may determine whether the memory address 434 corresponds to a CI cache entry of a plurality of CI cache entries 416(0)-416(C) of a CI cache 414 (block 704). If the memory address 434 does correspond to a CI cache entry of the plurality of CI cache entries 416(0)-416(C) (i.e., a cache "hit" on the CI cache 414), processing resumes at block 706 of FIG. 7B. However, if the CMC 204 determines at decision block 704 that the memory address 434 does not correspond to a CI cache entry of the plurality of CI cache entries 416(0)-416(C) (or if the CI cache 414 is not in use), the CMC 204 next determines whether the outer ECC segment 502 of the input code word 436 indicates an error (block 708). The CMC 204 thus may be referred to herein as "a means for determining whether an outer ECC segment of the input code word indicates an error." If the outer ECC segment 502 of the input code word 436 does not indicate an error, the CMC 204 can conclude that the input code word 436 is uncompressed. Thus, the CMC 204 generates a ternary flag 438 indicating that the input code word 436 is uncompressed (block 710). In this regard, the CMC 204 may be referred to herein as "a means for generating a ternary flag indicating that the input code word is uncompressed, responsive to determining that an outer ECC segment of the input code word does not indicate an error." Processing then resumes at block 712 of FIG. 7B.

If the CMC 204 determines at decision block 708 that the outer ECC segment 502 of the input code word 436 indicates an error, the CMC 204 needs to determine if the error actually represents a CI indicating that the input code word 436 contains compressed data, or if the error is a result of data corruption. To make this determination, the CMC 204 inverts a specified plurality of bytes 512 of the outer ECC segment 502 (block 714). Accordingly, the CMC 204 may be referred to herein as "a means for inverting the specified plurality of bytes of the outer ECC segment, responsive to determining that an outer ECC segment of the input code word indicates an error." The CMC 204 then checks whether the outer ECC segment 502 indicates an error after inverting the specified plurality of bytes 512 (block 716). The CMC 204 thus may be referred to herein as "a means for determining whether the outer ECC segment indicates an error after inverting the specified plurality of bytes."

If, after the specified plurality of bytes 512 are inverted, the outer ECC segment 502 no longer indicates an error, the CMC 204 can conclude that the previously detected error was actually a CI. The CMC 204 thus generates the ternary flag 438 indicating that the input code word 436 is compressed (block 718). In this regard, the CMC 204 may be referred to herein as "a means for generating the ternary flag indicating that the input code word is compressed, responsive to determining that the outer ECC segment does not indicate an error after inverting the specified plurality of bytes." Processing then resumes at block 720 of FIG. 7B. However, if the outer ECC segment 502 still indicates an error after the specified plurality of bytes 512 are inverted, the compression status of the input code word 436 cannot be determined. Consequently, the CMC 204 generates the ternary flag 438 indicating that the input code word 436 has an unknown compression status (block 722). Accordingly, the CMC 204 may be referred to herein as "a means for generating the ternary flag indicating that the input code word has an unknown compression status, responsive to determining that the outer ECC segment indicates an error after inverting the specified plurality of bytes." Processing then resumes at block 724 of FIG. 7B.

Referring now to FIG. 7B, if the CMC 204 determines at decision block 704 that the memory address 434 corresponds to a CI cache entry of the plurality of CI cache entries 416(0)-416(C), the CMC 204 uses the CI cache entry to determine whether the input code word 436 is compressed (block 706). If the input code word 436 is determined to be compressed at decision block 706 (or if the CMC 204 generates the ternary flag 438 indicating that the input code word 436 is compressed at block 718 of FIG. 7A), the CMC 204 generates a decompressed data block 442 based on a data segment 500 of the input code word 436 (block 720). The CMC 204 then provides the decompressed data block 442 as a memory read result 440 (block 726). If the CMC 204 determines at decision block 706 that the input code word 436 is not compressed (or if the CMC 204 generates the ternary flag 438 indicating that the input code word 436 is uncompressed at block 710 of FIG. 7A), the CMC 204 provides the data segment 500 of the input code word 436 as the memory read result 440 (block 712).

If the CMC 204 generates the ternary flag 438 indicating that the input code word 436 has an unknown compression status at block 722 of FIG. 7A, the CMC 204 reads, from a master table 408 of the system memory 206, a CI of CIs 412(0)-412(Y) corresponding to the memory address 434

(block 724). The CMC 204 then determines whether the input code word 436 is compressed based on the CI of the CIs 412(0)-412(Y) (block 728). If so, the CMC 204 generates a decompressed data block 442 based on a data segment 500 of the input code word 436 (block 720). The CMC 204 then provides the decompressed data block 442 as a memory read result 440 (block 726). If the input code word 436 is determined at decision block 728 to be not compressed, the CMC 204 provides the data segment 500 of the input code word 436 as the memory read result 440 (block 712).

Providing memory bandwidth compression in chipkill-correct memory architectures according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 8:
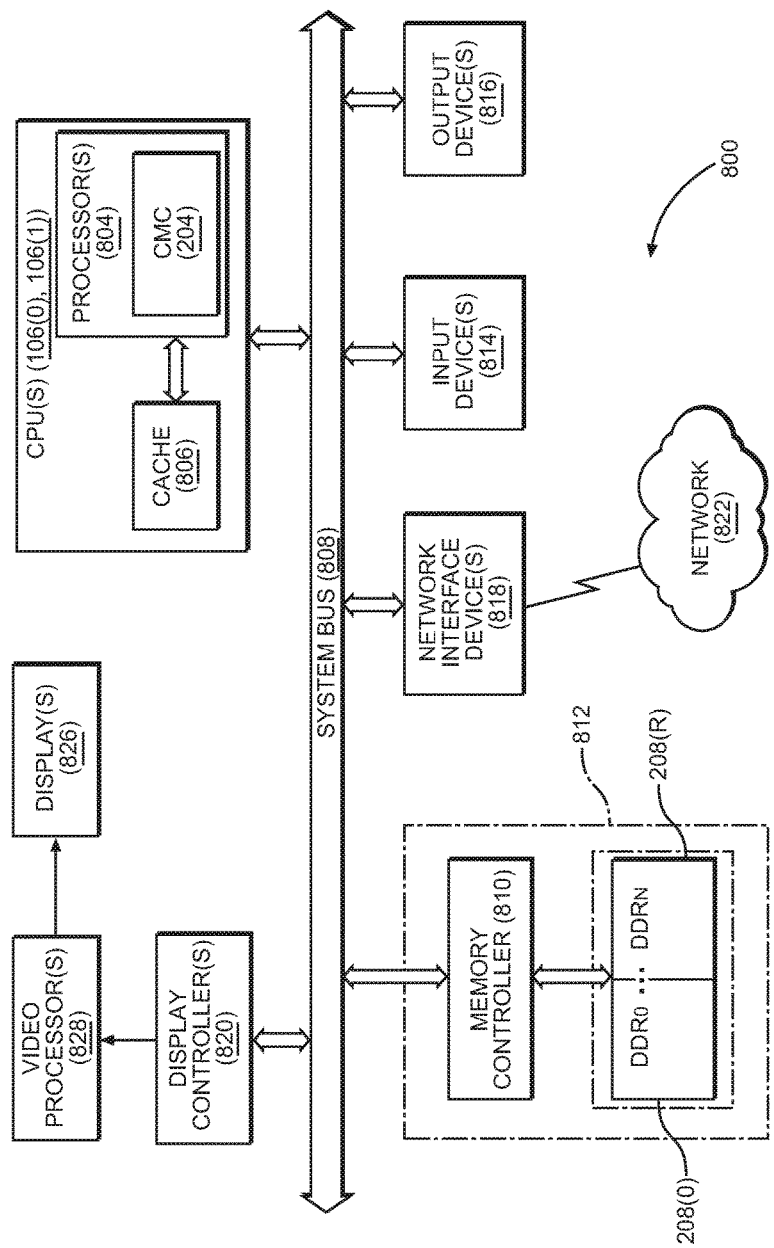
FIG. 8 is a block diagram of an exemplary processor-based system that may include the SoC of FIG. 2 that employs the CMC of FIGS. 2-4.

In this regard, FIG. 8 illustrates an example of a processor-based system 800 that may include the SoC 200 of FIG. 2 that employs the CMC 204 of FIGS. 2-4. In this example, the processor-based system 800 includes one or more of the CPUs 106(0), 106(1) of FIG. 1, each of which may include one or more processors 804. The CPU(s) 106(0), 106(1) may have cache memory 806 coupled to the processor(s) 804 for rapid access to temporarily stored data. The CPU(s) 106(0), 106(1) is coupled to a system bus 808 and can intercouple devices included in the processor-based system 800. As is well known, the CPU(s) 106(0), 106(1) communicates with these other devices by exchanging address, control, and data information over the system bus 808. For example, the CPU(s) 106(0), 106(1) can communicate bus transaction requests to the CMC 204 as an example of a slave device. The CPU(s) 106(0), 106(1) can communicate bus transaction requests to a memory controller 810 as another example of a slave device. Although not illustrated in FIG. 8, multiple system buses 808 could be provided.

Other devices can be connected to the system bus 808. As illustrated in FIG. 8, these devices can include a memory system 812, one or more input devices 814, one or more output devices 816, one or more network interface devices 818, and one or more display controllers 820, as examples. The input device(s) 814 can include any type of input device, including, but not limited to, input keys, switches, voice processors, etc. The output device(s) 816 can include any type of output device, including, but not limited to, audio, video, other visual indicators, etc. The network interface device(s) 818 can be any devices configured to allow exchange of data to and from a network 822. The network 822 can be any type of network, including, but not limited to, a wired or wireless network, a private or public network, a local area network (LAN), a wide local area network, wireless local area network, BLUETOOTH (BT), and the Internet. The network interface device(s) 818 can be configured to support any type of communications protocol desired. The memory system 812 can include one or more memory units such as the DRAM 208(0)-208(R) of FIG. 2.

The CPU(s) 106(0), 106(1) may also be configured to access the display controller(s) 820 over the system bus 808 to control information sent to one or more displays 826. The display controller(s) 820 sends information to the display(s) 826 to be displayed via one or more video processors 828, which process the information to be displayed into a format suitable for the display(s) 826. The display(s) 826 can include any type of display, including, but not limited to, a cathode ray tube (CRT), a liquid crystal display (LCD), a light emitting diode (LED) display, a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, Dynamic RAM (DRAM), Synchronous DRAM (SDRAM), a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sets other than the illustrated sets. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A compressed memory controller (CMC), comprising a memory interface configured to access a system memory via a system bus;
the system memory configured to employ a chipkill-correct error correcting code (ECC) mechanism;
the CMC configured to:
receive a memory write request comprising an uncompressed data block;
generate a compressed data block based on the uncompressed data block;
determine whether a size of the compressed data block exceeds a compression threshold;
responsive to determining that a size of the compressed data block exceeds a compression threshold:
generate an outer ECC segment based on the uncompressed data block; and
output, to the system memory, an output code word comprising a data segment containing the uncompressed data block and the outer ECC segment; and
responsive to determining that a size of the compressed data block does not exceed a compression threshold:
generate an inner ECC segment based on the compressed data block;
generate an outer ECC segment based on the compressed data block and the inner ECC segment;
invert a specified plurality of bytes of the outer ECC segment; and
output, to the system memory, the output code word comprising the data segment containing the compressed data block, the inner ECC segment, and the outer ECC segment.

2. The CMC of claim 1, further configured to:
receive a memory read request comprising a memory address;
retrieve an input code word from the memory address of the system memory;
determine whether an outer ECC segment of the input code word indicates an error;
responsive to determining that an outer ECC segment of the input code word does not indicate an error, generate a ternary flag indicating that the input code word is uncompressed; and
responsive to determining that an outer ECC segment of the input code word indicates an error:
invert the specified plurality of bytes of the outer ECC segment;
determine whether the outer ECC segment indicates an error after inverting the specified plurality of bytes;
responsive to determining that the outer ECC segment does not indicate an error after inverting the specified plurality of bytes, generate the ternary flag indicating that the input code word is compressed; and
responsive to determining that the outer ECC segment indicates an error after inverting the specified plurality of bytes, generate the ternary flag indicating that the input code word has an unknown compression status.

3. The CMC of claim 2, further configured to, responsive to the ternary flag indicating that the input code word is uncompressed, provide a data segment of the input code word as a memory read result.

4. The CMC of claim 2, further configured to, responsive to the ternary flag indicating that the input code word is compressed:
generate a decompressed data block based on a data segment of the input code word; and
provide the decompressed data block as a memory read result.

5. The CMC of claim 2, further configured to, responsive to the ternary flag indicating that the input code word has an unknown compression status:
read, from a master table of the system memory, a compression indicator (CI) corresponding to the memory address;
determine, based on the CI, whether the input code word is compressed;
responsive to determining that the input code word is compressed:
generate a decompressed data block based on a data segment of the input code word; and
provide the decompressed data block as a memory read result; and
responsive to determining that the input code word is not compressed, provide a data segment of the input code word as a memory read result.

6. The CMC of claim 2, further configured to, prior to determining whether an outer ECC segment of the input code word indicates an error:
determine whether the memory address corresponds to a compression indicator (CI) cache entry of a plurality of CI cache entries of a CI cache;
responsive to determining that the memory address corresponds to a CI cache entry of a plurality of CI cache entries of a CI cache:
determine, based on a CI of the CI cache entry, whether the input code word is compressed;
responsive to determining that the input code word is compressed:
generate a decompressed data block based on a data segment of the input code word; and provide the decompressed data block as a memory read result; and responsive to determining that the input code word is not compressed, provide a data segment of the input code word as a memory read result; and the CMC configured to determine whether an outer ECC segment of the input code word indicates an error responsive to determining that the memory address does not correspond to a CI cache entry of a plurality of CI cache entries of a CI cache.

7. The CMC of claim 1, wherein the specified plurality of bytes comprises a plurality of bytes that are stored on different memory devices of the system memory by the chipkill-correct ECC mechanism.

8. The CMC of claim 1 integrated into an integrated circuit (IC).

9. The CMC of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device (e.g., a smart watch, a health or fitness tracker, eyewear, etc.); a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

10. A method for providing memory bandwidth compression for a system memory configured to employ a chipkill-correct error correcting code (ECC) mechanism, comprising:

receiving, by a compressed memory controller (CMC), a memory write request comprising an uncompressed data block;

generating a compressed data block based on the uncompressed data block;

determining whether a size of the compressed data block exceeds a compression threshold;

responsive to determining that a size of the compressed data block exceeds a compression threshold:

generating an outer ECC segment based on the uncompressed data block; and outputting, to the system memory, an output code word comprising a data segment containing the uncompressed data block and the outer ECC segment; and responsive to determining that a size of the compressed data block does not exceed a compression threshold:

generating an inner ECC segment based on the compressed data block;

generating an outer ECC segment based on the compressed data block and the inner ECC segment;

inverting a specified plurality of bytes of the outer ECC segment; and outputting, to the system memory, the output code word comprising the data segment containing the compressed data block, the inner ECC segment, and the outer ECC segment.

11. The method of claim 10, further comprising:

receiving a memory read request comprising a memory address;

retrieving an input code word from the memory address of the system memory;

determining whether an outer ECC segment of the input code word indicates an error;

responsive to determining that an outer ECC segment of the input code word does not indicate an error, generating a ternary flag indicating that the input code word is uncompressed; and responsive to determining that an outer ECC segment of the input code word indicates an error:

inverting the specified plurality of bytes of the outer ECC segment;

determining whether the outer ECC segment indicates an error after inverting the specified plurality of bytes;

responsive to determining that the outer ECC segment does not indicate an error after inverting the specified plurality of bytes, generating the ternary flag indicating that the input code word is compressed; and responsive to determining that the outer ECC segment indicates an error after inverting the specified plurality of bytes, generating the ternary flag indicating that the input code word has an unknown compression status.

12. The method of claim 11, further comprising, responsive to the ternary flag indicating that the input code word is uncompressed, providing a data segment of the input code word as a memory read result.

13. The method of claim 11, further comprising, responsive to the ternary flag indicating that the input code word is compressed:

generating a decompressed data block based on a data segment of the input code word; and providing the decompressed data block as a memory read result.

14. The method of claim 11, further comprising, responsive to the ternary flag indicating that the input code word has an unknown compression status:

reading, from a master table of the system memory, a compression indicator (CI) corresponding to the memory address;

determining, based on the CI, whether the input code word is compressed;

responsive to determining that the input code word is compressed:

generating a decompressed data block based on a data segment of the input code word; and providing the decompressed data block as a memory read result; and responsive to determining that the input code word is not compressed, providing the data segment of the input code word as the memory read result.

15. The method of claim 11, further comprising, prior to determining whether an outer ECC segment of the input code word indicates an error:

determining whether the memory address corresponds to a compression indicator (CI) cache entry of a plurality of CI cache entries of a CI cache;

responsive to determining that the memory address corresponds to a CI cache entry of a plurality of CI cache entries of a CI cache:

determining, based on a CI of the CI cache entry, whether the input code word is compressed;

responsive to determining that the input code word is compressed:

generating a decompressed data block based on a data segment of the input code word; and providing the decompressed data block as a memory read result; and responsive to determining that the input code word is not compressed, providing a data segment of the input code word as a memory read result; and wherein determining whether an outer ECC segment of the input code word indicates an error is responsive to determining that the memory address does not correspond to a CI cache entry of a plurality of CI cache entries of a CI cache.

16. The method of claim 10, wherein the specified plurality of bytes comprises a plurality of bytes that are stored on different memory devices of the system memory by the chipkill-correct ECC mechanism.

17. A compressed memory controller (CMC) for providing memory bandwidth compression for a system memory configured to employ a chipkill-correct error correcting code (ECC) mechanism, comprising:
a means for receiving a memory write request comprising an uncompressed data block;
a means for generating a compressed data block based on the uncompressed data block;
a means for determining whether a size of the compressed data block exceeds a compression threshold;
a means for generating an outer ECC segment based on the uncompressed data block, responsive to determining that a size of the compressed data block exceeds a compression threshold;
a means for outputting, to the system memory, an output code word comprising a data segment containing the uncompressed data block and the outer ECC segment;
a means for generating an inner ECC segment based on the compressed data block, responsive to determining that a size of the compressed data block does not exceed a compression threshold;
a means for generating an outer ECC segment based on the compressed data block and the inner ECC segment;
a means for inverting a specified plurality of bytes of the outer ECC segment; and
a means for outputting, to the system memory, the output code word comprising the data segment containing the compressed data block, the inner ECC segment, and the outer ECC segment.

18. The CMC of claim 17, further comprising:
a means for receiving a memory read request comprising a memory address;
a means for retrieving an input code word from the memory address of the system memory;
a means for determining whether an outer ECC segment of the input code word indicates an error;
a means for generating a ternary flag indicating that the input code word is uncompressed, responsive to determining that an outer ECC segment of the input code word does not indicate an error;
a means for inverting the specified plurality of bytes of the outer ECC segment, responsive to determining that an outer ECC segment of the input code word indicates an error;
a means for determining whether the outer ECC segment indicates an error after inverting the specified plurality of bytes;
a means for generating the ternary flag indicating that the input code word is compressed, responsive to determining that the outer ECC segment does not indicate an error after inverting the specified plurality of bytes; and
a means for generating the ternary flag indicating that the input code word has an unknown compression status, responsive to determining that the outer ECC segment indicates an error after inverting the specified plurality of bytes.

19. A non-transitory computer-readable medium having stored thereon computer executable instructions which, when executed by a processor, cause the processor to:
receive a memory write request comprising an uncompressed data block;
generate a compressed data block based on the uncompressed data block;
determine whether a size of the compressed data block exceeds a compression threshold;
responsive to determining that a size of the compressed data block exceeds a compression threshold:
generate an outer error correcting code (ECC) segment based on the uncompressed data block; and
output, to a system memory, an output code word comprising a data segment containing the uncompressed data block and the outer ECC segment; and
responsive to determining that a size of the compressed data block does not exceed a compression threshold:
generate an inner ECC segment based on the compressed data block;
generate an outer ECC segment based on the compressed data block and the inner ECC segment;
invert a specified plurality of bytes of the outer ECC segment; and
output, to the system memory, the output code word comprising the data segment containing the compressed data block, the inner ECC segment, and the outer ECC segment.

20. The non-transitory computer-readable medium of claim 19 having stored thereon computer executable instructions which, when executed by a processor, further cause the processor to:
receive a memory read request comprising a memory address;
retrieve an input code word from the memory address of the system memory;
determine whether an outer ECC segment of the input code word indicates an error;
responsive to determining that an outer ECC segment of the input code word does not indicate an error, generate a ternary flag indicating that the input code word is uncompressed;
responsive to determining that an outer ECC segment of the input code word indicates an error:
invert the specified plurality of bytes of the outer ECC segment;
determine whether the outer ECC segment indicates an error after inverting the specified plurality of bytes;
responsive to determining that the outer ECC segment does not indicate an error after inverting the specified plurality of bytes, generate the ternary flag indicating that the input code word is compressed; and
responsive to determining that the outer ECC segment indicates an error after inverting the specified plurality of bytes, generate the ternary flag indicating that the input code word has an unknown compression status.

21. The non-transitory computer-readable medium of claim 20 having stored thereon computer executable instructions which, when executed by a processor, further cause the processor to, responsive to the ternary flag indicating that the input code word is uncompressed, provide a data segment of the input code word as a memory read result.

22. The non-transitory computer-readable medium of claim 20 having stored thereon computer executable instructions which, when executed by a processor, further cause the processor to, responsive to the ternary flag indicating that the input code word is compressed:
- generate a decompressed data block based on a data segment of the input code word; and
- provide the decompressed data block as a memory read result.

23. The non-transitory computer-readable medium of claim 20 having stored thereon computer executable instructions which, when executed by a processor, further cause the processor to, responsive to the ternary flag indicating that the input code word has an unknown compression status:
- read, from a master table of the system memory, a compression indicator (CI) corresponding to the memory address;
- determine, based on the CI, whether the input code word is compressed;
- responsive to determining that the input code word is compressed:
  - generate a decompressed data block based on a data segment of the input code word; and
  - provide the decompressed data block as a memory read result; and
- responsive to determining that the input code word is not compressed, provide the data segment of the input code word as the memory read result.

24. The non-transitory computer-readable medium of claim 20 having stored thereon computer executable instructions which, when executed by a processor, further cause the processor to, prior to determining whether an outer ECC segment of the input code word indicates an error:
- determine whether the memory address corresponds to a compression indicator (CI) cache entry of a plurality of CI cache entries of a CI cache;
- responsive to determining that the memory address corresponds to a CI cache entry of a plurality of CI cache entries of a CI cache:
  - determine, based on a CI of the CI cache entry, whether the input code word is compressed;
  - responsive to determining that the input code word is compressed:
    - generate a decompressed data block based on a data segment of the input code word; and
    - provide the decompressed data block as a memory read result; and
  - responsive to determining that the input code word is not compressed, provide the data segment of the input code word as the memory read result; and
- wherein determining whether an outer ECC segment of the input code word indicates an error is responsive to determining that the memory address does not correspond to a CI cache entry of a plurality of CI cache entries of a CI cache.

* * * * *